US009846678B2

(12) United States Patent
Mathew et al.

(10) Patent No.: US 9,846,678 B2
(45) Date of Patent: Dec. 19, 2017

(54) FAST FOURIER TRANSFORM (FFT) CUSTOM ADDRESS GENERATOR

(71) Applicant: Apple Inc., Cupertino, CA (US)

(72) Inventors: Binu K. Mathew, Los Gatos, CA (US); Julia C. Ng, San Jose, CA (US)

(73) Assignee: Apple Inc., Cupertino, CA (US)

( * ) Notice: Subject to any disclaimer, the term of this patent is extended or adjusted under 35 U.S.C. 154(b) by 44 days.

(21) Appl. No.: 15/068,849

(22) Filed: Mar. 14, 2016

(65) Prior Publication Data

US 2017/0091147 A1 Mar. 30, 2017

Related U.S. Application Data

(60) Provisional application No. 62/235,356, filed on Sep. 30, 2015.

(51) Int. Cl.
*G06F 17/14* (2006.01)
*G11C 8/04* (2006.01)

(52) U.S. Cl.
CPC .............. *G06F 17/142* (2013.01); *G11C 8/04* (2013.01)

(58) Field of Classification Search
None
See application file for complete search history.

(56) References Cited

U.S. PATENT DOCUMENTS

| | | | | |
|---|---|---|---|---|
| 5,450,553 A | | 9/1995 | Kitagaki | |
| 5,623,621 A | | 4/1997 | Garde | |
| 6,247,034 B1 | | 6/2001 | Nakai | |
| 6,907,439 B1 | * | 6/2005 | Wicker | G06F 17/142 708/404 |
| 7,047,268 B2 | | 5/2006 | Harley | |
| 2003/0200414 A1 | * | 10/2003 | Harley | G06F 17/142 711/217 |
| 2014/0089369 A1 | * | 3/2014 | Wang | G06F 17/142 708/404 |
| 2017/0091147 A1 | * | 3/2017 | Mathew | G11C 8/04 |

* cited by examiner

*Primary Examiner* — David H Malzahn
(74) *Attorney, Agent, or Firm* — Meyertons, Hood, Kivlin, Kowert & Goetzel, P.C.

(57) ABSTRACT

An apparatus and method for Fast Fourier Transform (FFT) address generation is disclosed. The apparatus may include a counter circuit and circuitry configured to load an initial value into a counter circuit. The circuitry may be further configured to generate first and second output values by formatting a current value of the counter, and increment the current value of the counter circuit by an increment value to generate a next value. The circuitry may also be configured to modify the increment value in response to a determination that the next value is equal to a target value.

18 Claims, 10 Drawing Sheets

Initialization/ Re-initialization:

Stage 0:
Count = 0
Step = 2
Step/2 = 1

Stage 1:
Count = 0
Step = 4
Step/2 = 2

Stage 2:
Count = 0
Step = 8
Step/2 = 4

Generated Addresses:

Stage 0:
Odd Index: 1, 3, 5, 7, . . ., 255
Even Index: 0, 2, 4, 6, . . ., 254

Stage 1:
Odd Index: 2, 6, 10, 14, . . ., 254, 3, 7, , 11, . . ., 255
Even Index: 0, 4, 8, 12, . . ., 252, 1, 5, 9, . . ., 253

Stage 2:
Odd Index: 4, 12, . . ., 252, 5, 13, . . ., 253, 6, 14, . . ., 254, 7, 15, . . ., 255
Even Index: 0, 8, . . ., 248, 1, 9, . . ., 249, 2, 10, . . ., 250, 3, 11, . . ., 251

*FIG. 3*

Initialization/ Re-initialization:

Stage 0:
- Stride = 128
- Index = base
- Count = 0
- Step = 2

Stage 1:
- Stride = 64
- Index = base
- Count = 0
- Step = 4

Stage 2:
- Stride = 32
- Index = base
- Count = 0
- Step = 8

Generated Addresses:

Stage 0:
- Index: 0, 0, . . ., 0 (128 times)

Stage 1:
- Index: 0, 0, . . ., 0, 64, 64, . . . 64 (64 times each)

•
•
•

Stage 6:
- Index: 0, 0, 2, 2, 4, 4, 6, 6, . . ., 124, 124, 126, 126

Stage 7:
- Index: 0, 1, 2, 3, . . ., 126, 127

*FIG. 4*

FAST FOURIER TRANSFORM (FFT) CUSTOM ADDRESS GENERATOR

PRIORITY CLAIM

The present application claims benefit of priority to provisional application No. 62/235,356 titled "FAST FOURIER TRANSFORM (FFT) CUSTOM ADDRESS GENERATOR" and filed on Sep. 30, 2015, the entire contents of which is incorporated by reference in its entirety as though fully and completely set forth herein.

BACKGROUND

Technical Field

Embodiments described herein are related to the field of integrated circuit implementation, and more particularly to the address generation for memory access.

Description of the Related Art

Computing systems may include one or more processors for executing program instructions (commonly referred to as "software," "firmware," or "microcode). Such program instructions may be stored in a memory within a computing system. Alternatively, or additionally, program instructions may be stored in other mass storage devices, such as, hard disk drives, compact discs (CDs), and the like.

In addition to processors and memories, computing systems may include dedicated collections of circuits (commonly referred to as "Intellectual Property (IP) blocks" or simply "blocks") that are dedicated to specific tasks. Such tasks may include formatting graphics or video data for display, sending and receiving data via a wired or wireless network, processing input from external sensors, microphones, and the like.

Data received from such external sensors may be processed according to a desired algorithm. In some cases, such as with audio data, for example, received data may be converted to the frequency domain using a Fast Fourier Transform (FFT) in order to perform additional analysis of the data.

SUMMARY OF THE EMBODIMENTS

Various embodiments of a processor are disclosed. Broadly speaking, a system, an apparatus, and a method are contemplated in which the apparatus includes a plurality of registers and circuitry coupled to the plurality of registers. The circuitry may be configured to set a count value to an initial value, and format the count value of the counter to generate first and second output values. The first and second output values may correspond to addresses used to access memory locations in a pattern according to execution of a Fast Fourier Transform (FFT) algorithm. The circuitry may be further configured to increment the count value of the counter circuit by an increment value to generate a next count value. In response to a determination that a processing stage of an FFT operation has completed, the circuitry may be further configured to re-set the count value to the initial value, and modify the increment value.

In another embodiment, increment value may be stored in a corresponding register of the plurality of registers.

In a further embodiment, to modify the increment value, the circuitry may be further configured to perform a shift left operation in the corresponding register of the plurality of registers.

BRIEF DESCRIPTION OF THE DRAWINGS

The following detailed description makes reference to the accompanying drawings, which are now briefly described.

FIG. 3 illustrates address generation for FFT memory access.

FIG. 4 illustrates address generation of FFT twiddle factor access.

Figure 1:
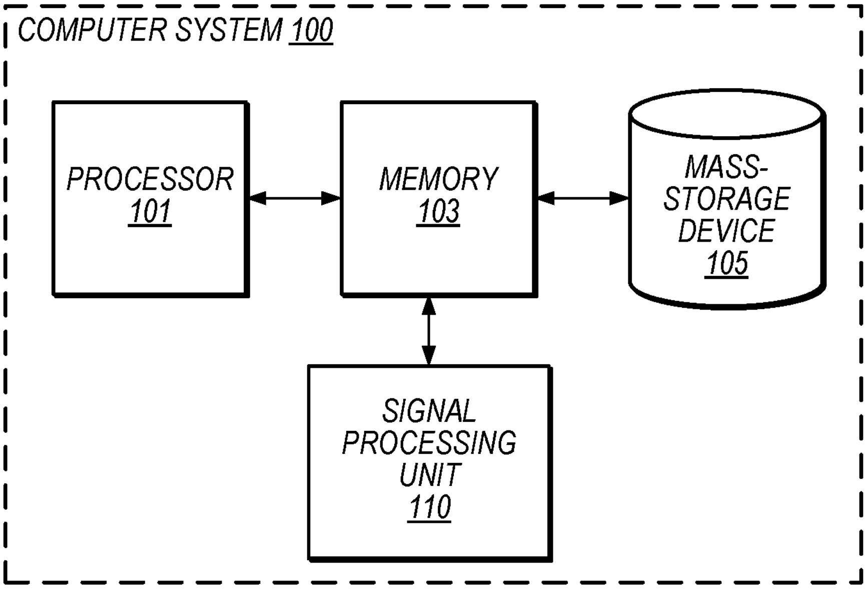
FIG. 1 illustrates a block diagram of an embodiment of a computing system.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF EMBODIMENTS

In a computer system, processors, processor cores, or other blocks may access memory to retrieve program instructions and data, or store recently modified data for retrieval at a later time. In some cases, the locations in memory that are being accessed are not random, but follow a distinct pattern, and the addresses corresponding to the desired locations in memory may be algorithmically calculated. Address generators may be used to perform the necessary calculations. Such generators may allow for high levels of execution parallelism using few encoded instruction bits, as well as increased efficiency and greater throughput. Additionally, address generators may be designed to provide common access patterns such as, e.g., Fast Fourier Transform (FFT) bit-reversed access, and base stride access. For each memory, or port in a multi-ported memory, a separate address generator may be employed or address generators may be shared between multiple ports.

A common case for accessing a memory is base-stride addressing. Each address may be calculated by f(i)=base+i·stride, where base is initial starting address, i is a positive integer, and stride is the step from one address to the next. Such an algorithm may be implemented in microcode instructions, however, it may require multiple instructions which would lead to increased area for the microcode memory, as well as added power consumption. The embodiments illustrated in the drawings and described below may provide techniques for generating addresses for memory access, while limiting area and power impact on the microcode memory.

For the purpose of clarity of explanation, in the algorithms disclosed herein, only index calculations are specified. In various embodiments, the indices may be used directly to access memory locations, while in other embodiments, the indices may be transformed into addresses using a base-stride or other suitable method.

Programs executed on computer systems, often refer to memory locations using indices. For example, individual elements of an array may be accessed using a corresponding index, such as, e.g., i, which may correspond to a particular location in memory of the computer system. Such indices may be converted to actual addresses to access the memory explicitly by a programmer, or automatically by compiler software. As described below, in more detail, the conversion from index to address may include adding a base address to the product of the index and an element and/or stride size. In some embodiments, the base address may be zero and the stride may be 1, resulting in a case where the index and the address are the same.

A block diagram illustrating an embodiment of computing system is illustrated in FIG. 1. Computer system 100 includes processor 101, memory 103, mass-storage device 105, and signal processing unit 110. It is noted that although specific components are shown and described in computer system 100, in alternative embodiments different components and numbers of components may be present in computer system 100. For example, computer system 100 may not include some of the memory hierarchy (e.g., memory 103 and/or mass-storage device 105). In addition, computer system 100 may include graphics processors, video cards, video-capture devices, user-interface devices, network cards, optical drives, and/or other peripheral devices that are coupled to processor 101 using a bus, a network, or another suitable communication channel (all not shown for simplicity).

In various embodiments, processor 101 may be representative of a general-purpose processor that performs computational operations. For example, processor 101 may be a central processing unit (CPU) such as a microprocessor, a microcontroller, a digital signal processor, an application-specific integrated circuit (ASIC), or a field-programmable gate array (FPGA). Although one processor 101 is illustrated, some embodiments of system 100 may include more than one processor 101. In various embodiments, processor 101 may implement any suitable instruction set architecture (ISA), such as, e.g., ARM™, C6000™, Blackfin® or x86 ISAs, or combination thereof.

The memory 103 and mass-storage device 105 are storage devices that collectively form a memory hierarchy that stores data and instructions for processor 101. More particularly, the mass-storage device 105 may be a high-capacity, non-volatile memory, such as a disk drive or a large flash memory unit with a long access time, while memory 103 may be smaller, with shorter access times. Memory 103 may store copies of frequently used data. Memory 103 may be representative of a memory device in the dynamic random access memory (DRAM) family of memory devices. In some embodiments, memory 103 and mass-storage device 105 are shared between one or more processors in computer system 100.

Signal processing unit 110 may, in various embodiments, be configured to execute one or more digital signal processing algorithms on data received by computer system 100 through an external sensor (not shown) or other data source. Such processing algorithms may include Fast Fourier Transform (FFT), Infinite Impluse Response (IIR) filtering, and the like.

In some embodiments, signal processing unit 110 may be configured to process audio data received from a microphone or other audio source. Signal processing unit 110 may process the audio data to detect specific words or phrases within the audio data.

It is also noted that the system illustrated in FIG. 1 is merely an example. In other embodiments, different functional blocks and different configurations of functional blocks may be possible dependent upon the specific application for which the system is intended.

Figure 2:
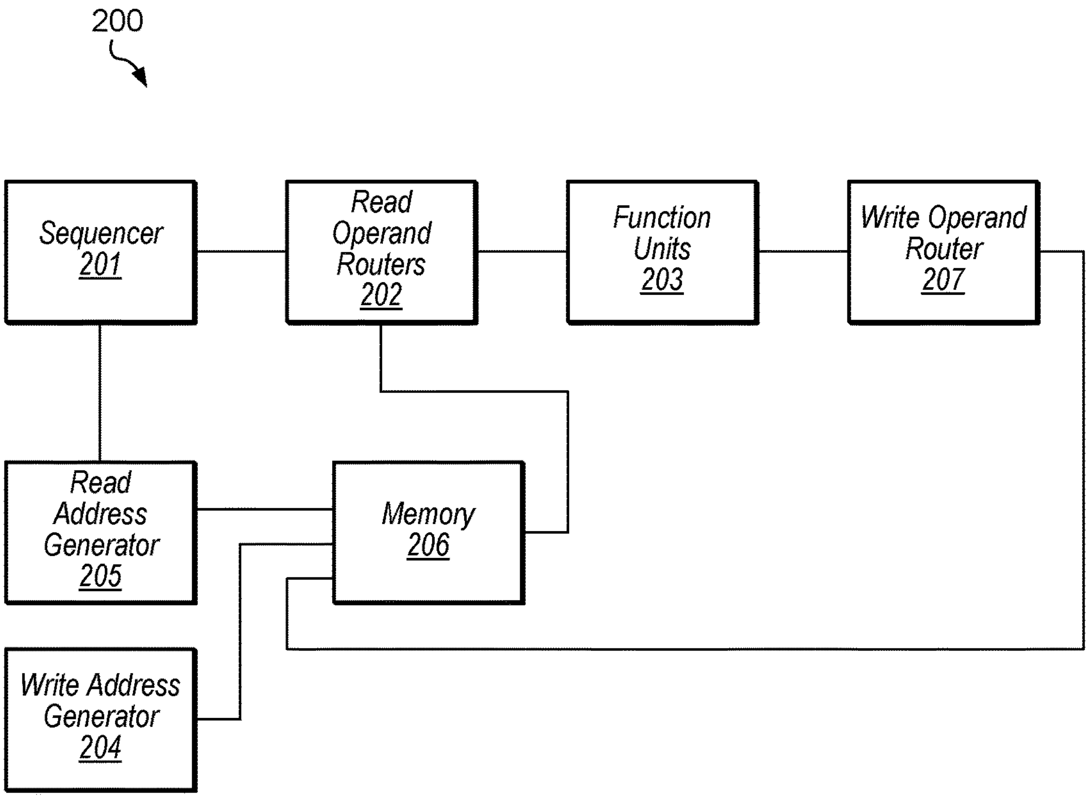
FIG. 2 illustrates a block diagram of a signal processing unit.

Turning to FIG. 2, a block diagram of a signal processing unit is illustrated. In various embodiments, signal processing unit 200 may correspond to signal processing unit 110 as depicted in the embodiment illustrated in FIG. 1. In the illustrated embodiment, signal processing unit 200 includes sequencer 201, operand router 202, function units 203, write address generator 204, read address generator 205, and memory 206. In various embodiments, signal processing unit 200 may be configured to operate on complex numbers. For example, a 64-bit data word may include both real and imaginary floating point numbers.

Sequencer 201 may include a microcode memory configured to store program instructions as well to perform instruction fetch, decode, hazard detection, stall, control functions, and the like. Sequencer 201 may also include logic circuits specifically configured to perform the stored program instructions such as instruction fetch, decode, hazard detection, stall, control functions and the like. Logic circuits external to sequencer 201 (not shown) may select an entry address for the start of execution of a portion of the program instructions stored in the microcode memory and then signal sequencer 201 to begin execution at the selected entry address. In response to execution of program instructions by sequencer 201, data may be read from memory 206, routed into function units 203. Once function units 203 have operated upon the data, results may then be re-written back into memory 206.

Function units 203 may, in some embodiments, be organized into real and imaginary sides to operate on the complex numbers. In various embodiments, function units 203 may include Arithmetic Logic Units (ALUs), as well as circuits dedicated to performing square root and logarithmic calculations. In some embodiments, sub-units included in function units 203, may be organized in a pipelined fashion, allowing different stages to perform different operations at different times.

Read operand router 202 may be configured to selectively route data from memory 206 into function units 203. Write operand router 207 may be configured to selectively route data from function units 203 to memory 206. In various embodiments, read operand router 202 may individually route real or imaginary portions of a complex number into a port of function units 203. Additionally, write operand router 207 may individually route real or imaginary portions of a complex number into a port of memory 206.

Memory 206 may be configured to store parameters set by system software, intermediate data used during calculations, and the like. In some embodiments, so-called "twiddle factors" used in FFT, which refer to multiplicative constants used in the transform, may also be stored in memory 206. Although memory 206 is depicted as a single memory, in other embodiments, any suitable number of memories may be employed. In cases where multiple memories are employed, each memory may be configured to store different data, such as the aforementioned intermediate data. Each memory may be read independently of the others, allowing multiple read accesses to be performed simultaneously.

In the course of executing an FFT algorithm, the data stored in memory 206 may need to be accessed according to a predetermined sequence. As described below in regard to FIGS. 3 and 4, the sequence for accessing the intermediate data may be different than the sequence for accessing the twiddle factors. In some embodiments, different address generators may be employed for memory access versus twiddle factor access while, in other embodiments, a single address generator may be capable of producing addresses used in both types of accesses.

Memory 206 may incorporate multiple instances of memory circuits, such as, e.g., Static Random Access Memory (SRAM), or a Read Only Memory (ROM), or any suitable combination thereof.

To access memory 206 at the desired locations, address generators are employed to create the desired addresses for accessing memory 206. As described above, addresses may be generated from indices. As used and described herein, the terms indices and addresses are used interchangeably with the understanding that, in some embodiments, indices may be transformed into addresses. In the illustrated embodiment, separate read and write address generators are employed. In some embodiments, multiple read address generators may be used to allow for parallel read access to different memories included in memory 206.

As will be described below in more detail, read address generator 205 and write address generator 204 may generate addresses in accordance with a predetermined FFT algorithm. In cases where multiple read address generators are employed, each read address generator may create addresses using different respective algorithms. For example, a particular read address generator may implement a base-stride addressing algorithm, while other read address generators may implement any suitable addressing algorithm. By implementing address generation, both read and write, as specialized hardware circuits, program instructions for calculating the addresses may be omitted from the microcode memory in sequencer 201, thereby saving area and power, in some embodiments. The omission of address calculation instructions reduces a number of executed instructions in the program leading to faster execution especially inside of loops. In some embodiments, faster execution may allow for logic circuits to quickly be placed in a low power state following signal processing, thereby reducing power consumption.

It is noted that the embodiment of signal processing unit 200 as illustrated in FIG. 2 is merely an example. Some blocks included within signal processing unit 200, and some connections between the blocks have been omitted for the sake of clarity. In other embodiments, different blocks and different configurations of blocks are possible and contemplated.

As previously mentioned, during complex FFT operations, memory locations may be addressed in accordance with a predefined algorithm. One such algorithm is illustrated in Example 1, shown below. In Example 1, the two inner for-loops, one for j and the other for even_index, together result in the same number of inner loop body executions independent of the current value of stage in the outer for-loop. For example, for a 256-point complex FFT, the number of innermost loop body executions is 128 regardless of the current value of stage in the outer loop. Although the processing order varies from iteration to iteration, the aforementioned inner for-loops touch every element exactly once. It is noted that the last odd_index processed by the two inner for-loops is always 255. In various embodiments, the detection of the value of 255 for the odd_index may assist in the determination that the address generator has reached the end of the inner for-loops and needs to be re-initialized. The outer for-loop may then also be advanced by shifting the value of SN by one bit and resetting the count to zero, to continue processing the next stage of the FFT.

Each stage the step size, by which the counter counts, varies to allow for the creation of desired indices. The value from the counter may be split into high and low bits, which may, in some embodiments, be combined using a bitwise OR operation to obtain even_index. At a particular stage of the FFT operation, s+1, there are $\log_2(s)$ zeros at the least significant end of the counter since the counter increases by a power of 2. These bits may be set to the value of j, which, in this implementation, is the same of the value of the high bits of the counter. Odd_index may be generated by combining even_index with SN_by_2 using a bitwise OR operation.

While performing an FFT operation, in addition to memory accesses, predetermined multiplicative constants (commonly referred to as "twiddle factors") may be read from storage and used in the calculations for each stage of the FFT. Such twiddle factors may be accessed in a predetermined sequence and, as such, the addresses to read the twiddle factors from memory may be generated algorithmically. The generation of the addresses to retrieve the twiddle factors is also presented in Example 1. For each pass through the j inner for-loop, a new twiddle factor needs to be retrieved from storage. Additionally, each time the algorithm moves to the next stage, the twiddle factors need to be reset. While the innermost loop is executed, the twiddle factor remains the same. It is noted that during the first stage, only one twiddle factor is used, so the algorithm returns the same value 128 times. In contrast, during the final stage, the twiddle factor changes each time. The stride value is a power of 2, and may change with each stage. For example, in the first stage, the stride is 128, in the second stage, the stride is 64, and so forth. During the final stage, the stride value is 1.

It is noted that Example 1 is merely one representative algorithm. In other embodiments, differences in the execution of the for-loops is possible and contemplated. It is further noted that since the generation of addresses to access the memory, as well as retrieve twiddle factors, both rely on a determination of when the loop index j changes and when the stage changes, dedicated circuits to generate the aforementioned addresses may share portions of the their respective designs.

Example 1: FFT Algorithm

```
for stage in range(1,nstage+1):
    SN = 1 << stage
    SN__by__2 = SN/2•
    SW = twiddle__v[stage]
    twiddle = 1+0j•
    for j in range(SN__by__2):
        for even__index in range(j,N,SN):
            odd__index = even__index + SN__by__2
            x__e = x__v[even__index]
            x__o = x__v[odd__index]
            t = x__o * twiddle
            x__v[even__index] = x__e + t
            x__v[odd__index] = x__e − t
        twiddle *= SW
return x__v
```

An embodiment of an algorithm for generating Complex FFT addresses is illustrated in Example 2. A state machine may, in some embodiments, be configured to implement the algorithm. In various embodiments, the _init_( ) function may include configuration steps performed by system software to setup the associated hardware. During execution, the start ( ) function includes both initialization and re-initialization steps that may be performed at the start of operation or during a stage change.

The value of even_index may be returned by evoking get_index (0), and the value of odd_index may be returned by evoking get_index (1). Once the indices corresponding to a given iteration have been consumed, the next ( ) function is executed. In various embodiments, the next ( ) function may increment the count value as well as adjust the step size.

It is noted that in the embodiment of Example 2, is directed towards address generation for Complex FFT operations, i.e., FFT operations that can be used with complex numbers. In some embodiments, a Complex FFT may be used as a building block for implementing an optimized real valued FFT. Some actual implementations may employ a Complex FFT as part of a real number valued FFT.

Example 2: Complex FFT Address Generator Algorithm

```
class ComplexFFTAddressGenerator(object):
    def ___init___(self, N):
        self.N = N
        self.nbits = int(ceil(log2(N)))
    def start(self):
        self.count = 0
        self.SN = 2
        self.SN__by__2 = 1
    def get__index(self, which):
        even__index = self.get__even__index( )
        if which:
            return even__index | self.SN__by__2
        return even__index
    def get__even__index(self):
        high__bits = self.count >> self.nbits
        low__bits = self.count & (self.N−1)
        even__index = low__bits | high__bits
```

-continued

```
        return even__index
    def next(self):
        even__index = self.get__even__index( )
        odd__index = even__index | self.SN__by__2
        if odd__index == self.N−1:
            self.count = 0
            self.SN <<= 1
            self.SN__by__2 <<= 1
        else:
            self.count += self.SN
```

An embodiment of an algorithm for generating twiddle addresses is illustrated in Example 3. As with the embodiment depicted in Example 2, the _init_( ) function may include configuration steps performed by system software to setup the associated hardware. During execution, the start ( ) function includes both initialization and re-initialization steps that may be performed at the start of operation or during a stage change. In the present example, the initialization and re-initialization steps may include setting an initial value for the index, as well as, setting initial values for the variables count, stride, and SN.

After initialization or re-initialization, the next ( ) function generates the next state of the address generator. The algorithm may determine if the nth bit of the count value is changing. As described below in more detail, the nth bit is a function of the size of the FFT. If the nth bit of the count value changes from the current count value to the next count value, the index value is incremented by the stride value. Additionally, when the index value reaches a last value indicating that the final twiddle factor for the current stage has been passed, the stage indicator SN is advanced to the next stage, the stride value in incremented, and the count and index values are re-initialized.

Example 3: Twiddle Address Generator Algorithm

```
class TwiddleAddressGenerator(object):
    def ___init___(self, N):
        self.last = N/2
        self.first = 0
        self.nbits = int(ceil(log2(N)))
    def start(self):
        self.index = self.first
        self.stride = 1 << (self.nbits−1)
        self.count = 0
        self.SN = 2
    def get__index(self):
        return self.index
    def next(self):
            // if n-th bit of count is changing, then
update the index
        prev__bit = self.count & (1 << self.nbits)
        self.count += self.SN
        cur__bit = self.count & (1 << self.nbits)
        bit = prev__bit ^ cur__bit
        if bit:
            self.index += self.stride
            // if the final twiddle factor has been passed,
advance to next stage and re-init
        if self.index == self.last:
            self.count = 0
            self.SN <<= 1
            self.index = self.first
            self.stride = self.stride >> 1
```

The algorithms illustrated in Examples 1-3 are presented for illustrative purposes. In other embodiments, the calculations included in each of the algorithms may be modified to be suitable with logic circuit design. It is noted that the algorithms depicted in Examples 1, 2, and 3 are intended to operate on unsigned integers. In other embodiments, different operations may be employed to account for signed bits. In cases where the description included herein deviates from the embodiments of Examples 1-3, it is noted that embodiments described in Examples 1-3 are preferred.

Turning to FIG. 3, an example of a memory address sequence used during a 512 point complex FFT operation is illustrated based on the algorithm described above in regard to Example 1 and Example 2. In the illustrated embodiment, addresses for the first three of eight stages of the FFT operation are depicted. Additionally, settings for variables used in the generation of the address sequences are shown for each stage. It is noted, that the three depicted stages are merely for the purposes of illustration, and that actual implementations may employ any suitable number of stages. It is further noted that the aforementioned method of address generation may be generalized to an FFT of any size that is a power of two or to sizes that are not powers of two by zero padding or other modifications to the FFT algorithm.

In stage 0, Count is initialized to zero, Step is initialized to two, and Step/2 is set to one. As described below in more detail in regard to FIG. 5, the aforementioned variable values are used to generate the odd and even indices. As indicated, the Odd Index includes odd numbers from 1 to 255 (the last or maximum index value for this particular addressing scheme). The Even Index includes even numbers between 0 and 254.

When stage 0 has completed, the values of Count, Step, and Step/2 are re-initialized. In the present embodiment, count is reset to zero, while step is set to four and Step/2 is initialized to two. Using the new values for the variables, the odd and even indices take on different values. During stage 1, the Odd Index includes values starting at two and counts by four to a value of 254, at which point, the sequence continues starting at three and counts by four to a value of 255 (the maximum value). The Even Index starts at zero and proceeds by four to a value of 252, at which point, the sequence continues from one and counts by four to a value of 253.

At the start of Stage 2, the variables are again re-initialized. In this case, Count is reset to zero, step is set to 8, and Step/2 is set to four. The re-initialized values are then used to generate new values for the odd and even indices. The Odd Index begins at 4 and increases by 8 until a value of 252 is reached. At that point, the Odd Index value changes to 5 and continues, incrementing by 8, until the value of 253 is achieved. Finally, the Odd Index value changes to 7 and increments by 8 until the value of 255 is reached.

In a similar fashion, the Even Index begins at zero, and increments by 8 until the value of 248 is reached. At that point, the Even Index value transitions to 1 and increments by 8 until the value of 249 is achieved. The Even Index value then changes to 2, and proceeds, counting by 8, until the value 250 is achieved. Finally, the Even Index value transitions to 3, and increments by 8 until the final value of 251 is reached.

It is noted that the embodiment illustrated in FIG. 3 is merely an example. In other embodiments, different sequences of addresses that support other signal processing operations may be possible.

Turning to FIG. 4, a diagram depicting address generation for accessing a sequence of twiddle factors during a FFT operation is illustrated. In the present embodiment, the twiddle factors, or any suitable portion thereof, may be stored in any suitable location. For example, the twiddle factors may be stored sequentially in memory addresses 0 through 127 as described above in regard to Example 1 and Example 3. Twiddle factors may be stored at any other memory address using a transformation similar to base-stride as described above. As above, the data for only a few stages of the FFT operation is shown. In actual implementations, addresses for accessing twiddle factors may be generated for each stage of the FFT operation.

During the initial stage, i.e., Stage 0, the variables Stride, Index, Count and Step are initialized. The value of Index, which will contain the addresses to be used for accessing the twiddle factors, is set to a base value, which may be dependent upon a particular embodiment. The value of Count is set to zero, the value of Stride is set to 128, and the value of Step is set to 2. During stage 0, 128 addresses, each of which will have a value of zero, will be generated. Once the last index has been reached, the next stage of the FFT operation may begin.

At the start of Stage 1, Count and Index are re-initialized to zero and base, respectively. The value of Stride is initialized to 64 and the value of Step is set to four. By setting Step and Stride to these particular values, a different set of addresses may then be generated for accessing twiddle factors during stage 1. In the present stage, the sequence of generated addresses, i.e., the value of Index, includes zero repeated 64 times, followed by 64 repeated 64 times.

The process of re-initializing the variables and generating addresses may then continue for each remaining stage. For example, in Stage 6, a sequence of even numbers, each one of which is repeated twice is generated. In the final stage, the generated addresses start at zero, and proceed to 127, incrementing by one.

It is noted that address scheme depicted in FIG. 4 is merely an example. In other embodiments, different initialization values and different sequences of addresses may be employed.

As described above in regard to FIG. 3, during a FFT operation, a sequence of addresses may be generated to access memory for each stage of the FFT operation. Each stage may require a different sequence addresses in order to properly implement the FFT operation. Moving to FIG. 5, a flow diagram depicting an embodiment of a method for generating addresses to access a memory during a FFT operation is illustrated. The method begins in block 501. A count value and a step may then be initialized (block 502). In various embodiments, a counter may be reset to a value of all logical-0s and a register may be loaded with a initial step size.

Address indices may then be calculated dependent upon a value of the counter (block 503). As described above in regard to FIG. 3, the indices may include both an even and an odd index that may correspond to addresses used in the sequential addressing scheme of a FFT algorithm. As described below in more detail in regard to FIG. 4, the value of the counter may be formatted to generate the even index. The even index may then be combined with additional information to generate the odd index. By processing the count value in such a manner, two indices that comply with the FFT memory access scheme may be generated from a single count value.

The method may then depend on the value of the odd index (block 504). In various embodiments, if the odd index has not yet reached a maximum value, such as, e.g., a value consisting of all logical-1s, then the count value may be incremented (block 505). The count value may, in some embodiments, be incremented by the step size stored in the register. In various embodiments, the step size value may be added to the count value, and the resultant sum may then be stored in the in counter to be used in further calculations. The method may then proceed from block 503 as described above.

If, however, the odd index has reached the maximum value, then the operation is dependent on the stage of the FFT operation (block 506). If the last stage has been reached, then the method may conclude in block 507.

Alternatively, if the last stage has not yet been reached, then the count value may be re-initialized and the step size value may be modified (block 508). In various embodiments, the count value may be reset to zero, or any other suitable value. The step size value may, in some embodiments, be incremented by a factor of two. In certain embodiments, a shift operation may be performed on the register, in which the step size value is stored, thereby generating a new step size value that is twice the old step size value. The method may then proceed from block 503 as described above.

Figure 5:
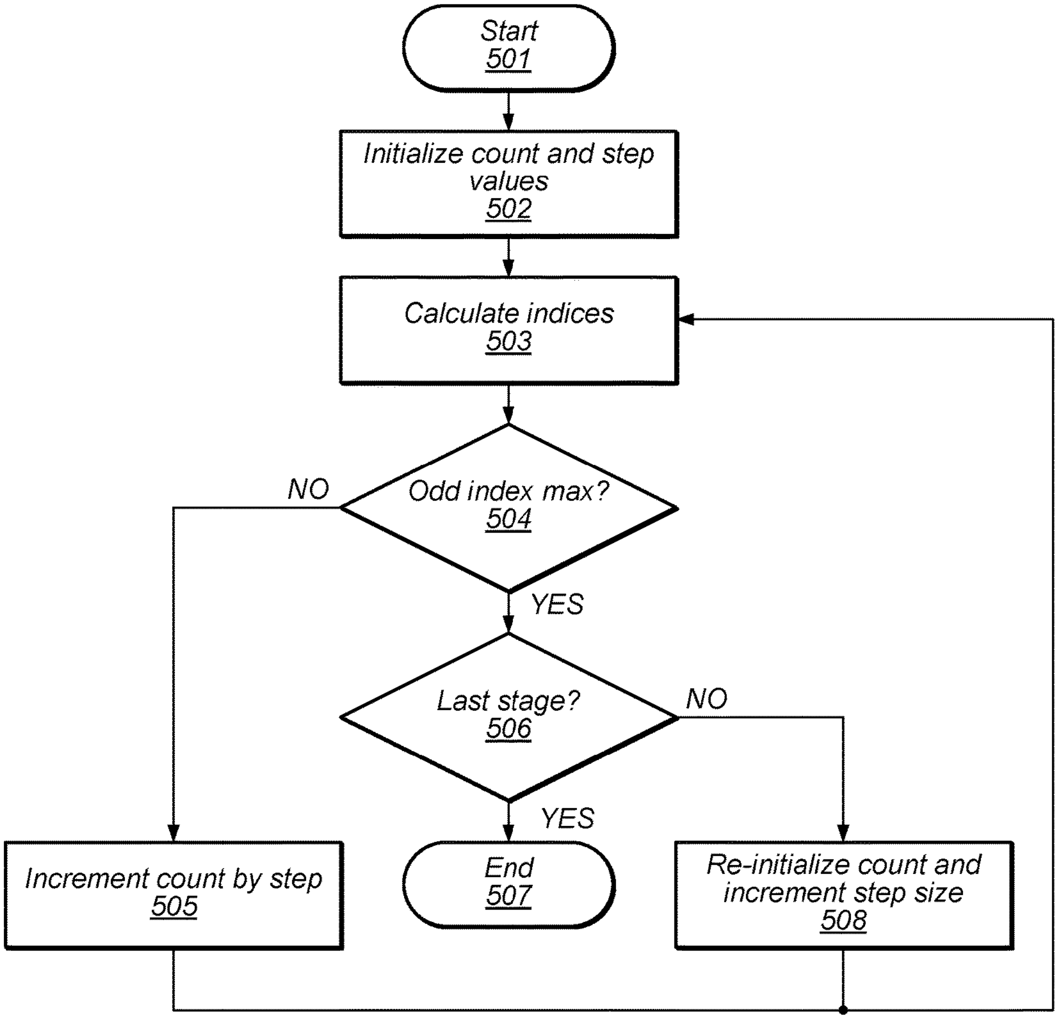
FIG. 5 illustrates a flow diagram of an embodiment of a method for generating addresses for memory access while performing an FFT operation.

It is noted that the embodiment of the method depicted in the flow diagram illustrated in FIG. 5 is merely an example. In other embodiments, different operations, and different orders of operations may be employed.

Figure 6:
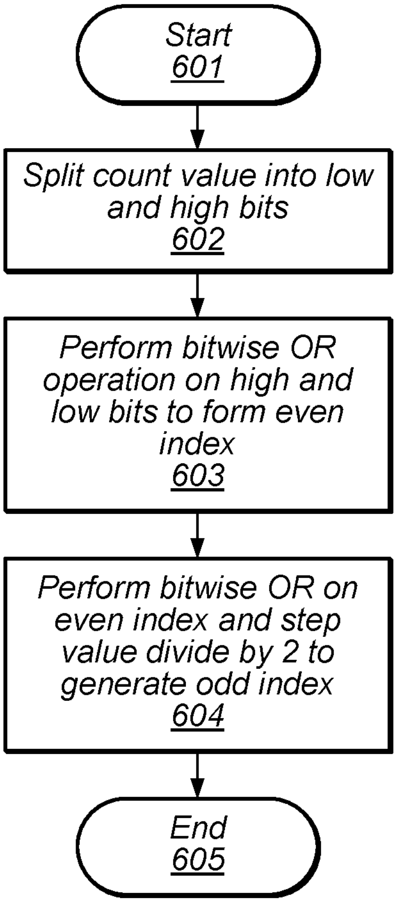
FIG. 6 illustrates a flow diagram of an embodiment of a method for calculating indicies to be used in memory access using a count value.

As described above, multiple indices may be generated from a single count value. A flow diagram depicting an embodiment of a method for generating two indices used in FFT memory access from a single count value is illustrated in FIG. 6. In various embodiments, the method depicted in the flow diagram of FIG. 6, may correspond to the operation described in block 503 of the flow diagram illustrated in FIG. 5. The method begins in block 601.

The count value may then be split into two parts (block 602). In some embodiments, to generate a data word containing the low order bits, a bitwise AND operation may be performed on the count value and a data word containing the maximum value of the FFT indices. The high order bits may be, in various embodiments, generated by shifting the count value by maximum number of stages of the FFT of given size.

A bitwise OR operation may then be performed on the data words containing the high and low order bits in order to generate an even index, such as those described above in regard to FIG. 3 (block 603).

Another bitwise OR operation may then be performed on using the even index and a data word containing half of the step value to generate an odd index, such as those described in regard to FIG. 3 (block 604). As with the previous bitwise OR operation, multiple OR gates may be employed. With the generation of the even and the odd indices, the operation may conclude in block 605.

The operations included in the flow diagram illustrated in FIG. 6 are depicted as being performed in a serial fashion. In other embodiments, one or more of the operations may be performed in parallel.

During an FFT operation, in addition to memory accesses, predetermined twiddle factors may be read from a separate memory and used in the calculations for each stage of the FFT. Such twiddle factors may be accessed in a predetermined sequence and, as such, the addresses to read the twiddle factors from memory may be generated algorithmically. An embodiment of a method for generating the addresses to read the twiddle factors for a FFT operation is depicted in the flow diagram illustrated in FIG. 7. The method begins in block 701.

A count value, an index value, a stride value, and a step value may then be initialized (block 702). It is noted that the index, stride and step values may be stored in respective registers, and that the count value may be stored in a counter or other suitable sequential logic circuit. In various embodiments, the count value may be initialized to zero, and the index value, which will be used to access the twiddle factors, may be initialized to a base value. In some embodiments, the stride value may be set to 128, and the step value may be set to 2.

A determination may then be made if the nth bit position of the count value is changing (block 703). The nth bit position may, in various embodiments, dependent on the size of the FFT. For example, in some embodiments, the nth bit position may be determined using equation 1 (below), wherein N is the size of FFT. As a specific example, when the size of the FFT is 512, the nth bit position is determined to be 9. As described below in more detail in regard to FIG. 8, a next count value may be generated, and the nth bit value of the previous count value and the newly generated next count value may be compared. The method may then depend on the result of the determination (block 704).

$$n=int(ceil(\log_2(N))) \tag{1}$$

If the nth bit of the count value is changing, then the index value may be incremented (block 705). In various embodiments, the stride value may be added to the index value, and the index value used to access the memory, in which the twiddle factors are stored. Alternatively, if it is determined that the nth bit of the count value is not changing, then the method may proceed from block 706 as described below.

The method may then depend on the current stage of the FFT operation (block 706). If the last stage of the FFT operation has been reached, then the method may conclude in block 707. If, however, the last stage has not yet been reached, then the method may depend on the value of the index (block 708). If the last index has not yet been reached, then the method may proceed from block 703 as described above. Alternatively, if the index has reached a final value, then the count and index values may be reset, and the stride and step values may be modified (block 709). In some embodiments, the count value may be reset to zero, and the index value may be reset to the base value. Additionally, the step value may be incremented by two, while the stride value may be divided by two. In various embodiments, a shift operation on the register storing the stride value may be performed, dividing the stored stride value by two. The operation may then proceed from block 703 as described above.

Figure 7:
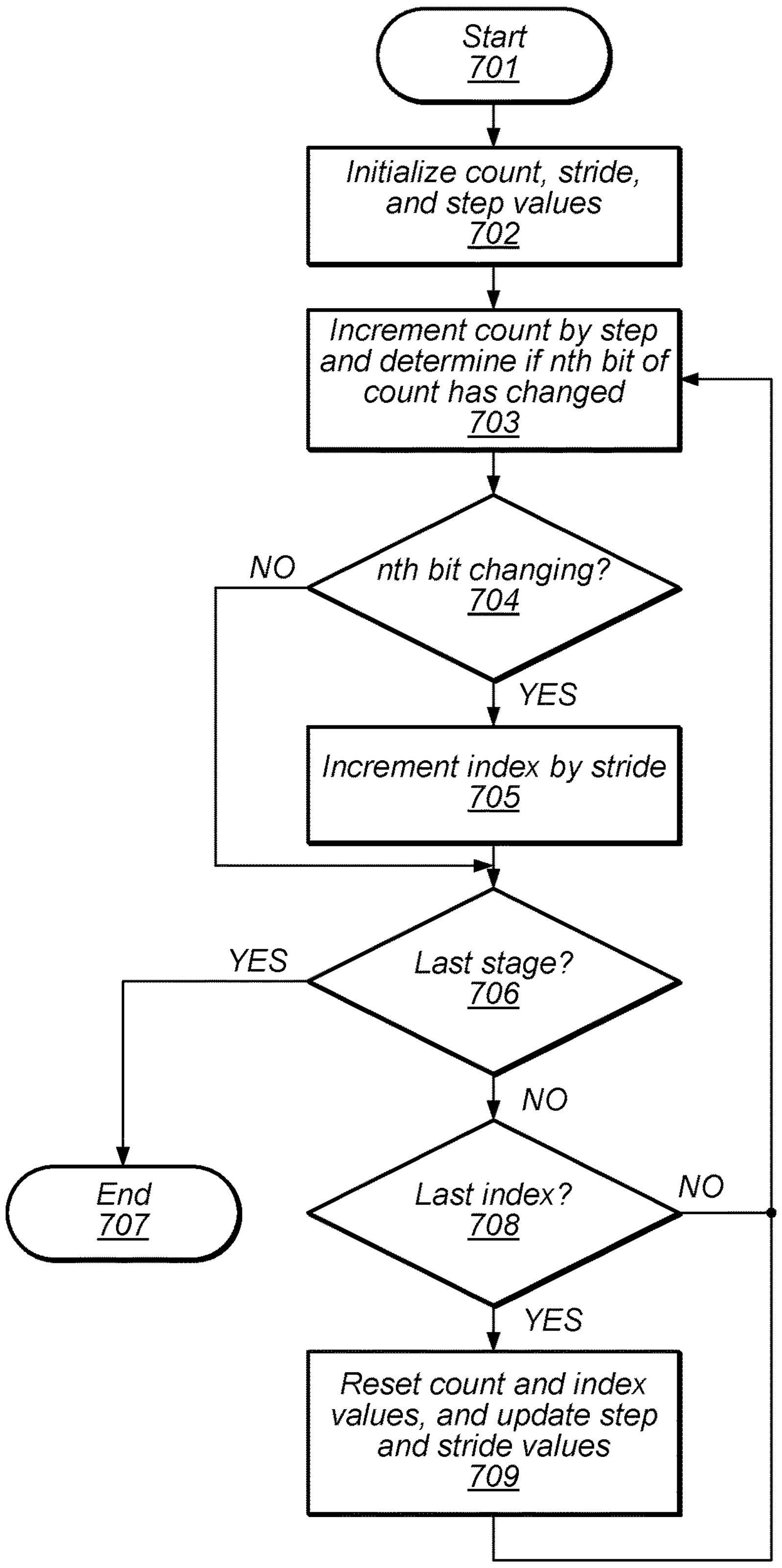
FIG. 7 illustrates a flow diagram of an embodiment of a method for generating addresses to access twiddle factors while performing an FFT operation.

It is noted that the embodiment illustrated in the flow diagram of FIG. 7 is merely an example. In other embodiments, different increment/decrement values for the stride and step values may be employed, in order to generate addresses compatible with other twiddle factor access algorithms.

The method described above in regard to FIG. 7, employs checking if the nth bit of the count value changes from one count value to the next. It is noted that there are numerous methods for determining if the nth bit has changed value, but that a particular method is depicted in the flow diagram illustrated in FIG. 8. It is further noted that the embodiment of the method depicted in the flow diagram of FIG. 8 may correspond to the operation described in relation to block 703 of the flow diagram illustrated in FIG. 7. The method begins in block 801.

The nth bit of the current count value may then be determined (block 802). In various embodiments, a bitwise AND operation may be performed on the current count value and a logical 1 value that has been shifted left by the value of n, which may be calculated in accordance with equation 1, as described above.

The count value may then be incremented (block 804). In various embodiments, the step value may be added to the current count value to generate a next count value. The next count value may then be stored in the counter.

In a similar fashion to the procedure described above, the nth bit of the next count value may then be determined (block 804). An exclusive OR operation may then be performed on the two nth bit values (block 805) to determine if the values are identical. The resultant information may then be used as described in block 704 of the flow diagram illustrated in FIG. 7. The method may then conclude in block 806.

Figure 8:
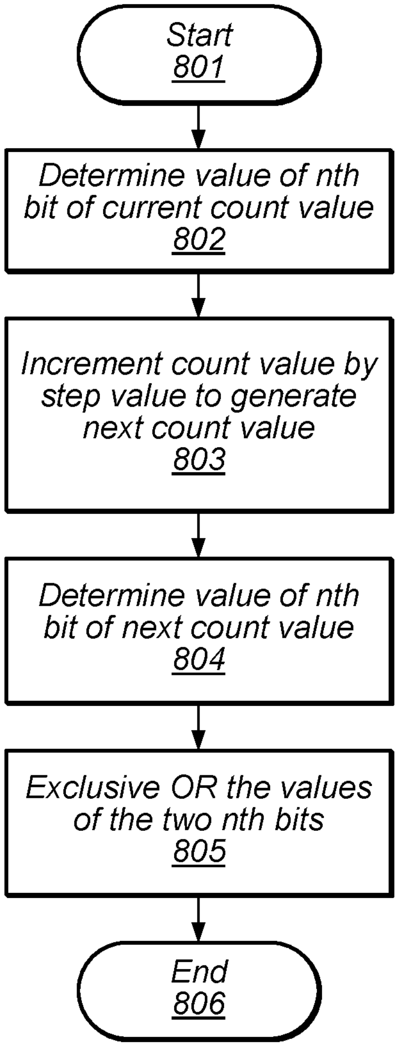
FIG. 8 illustrates a flow diagram of an embodiment of a particular bit of a count value is changing during the calculation of addresses to access twiddle factors.

It is noted that the method illustrated in FIG. 8 is merely an example. In other embodiments, different operations and different orders of operations are possible and contemplated.

Figure 9:
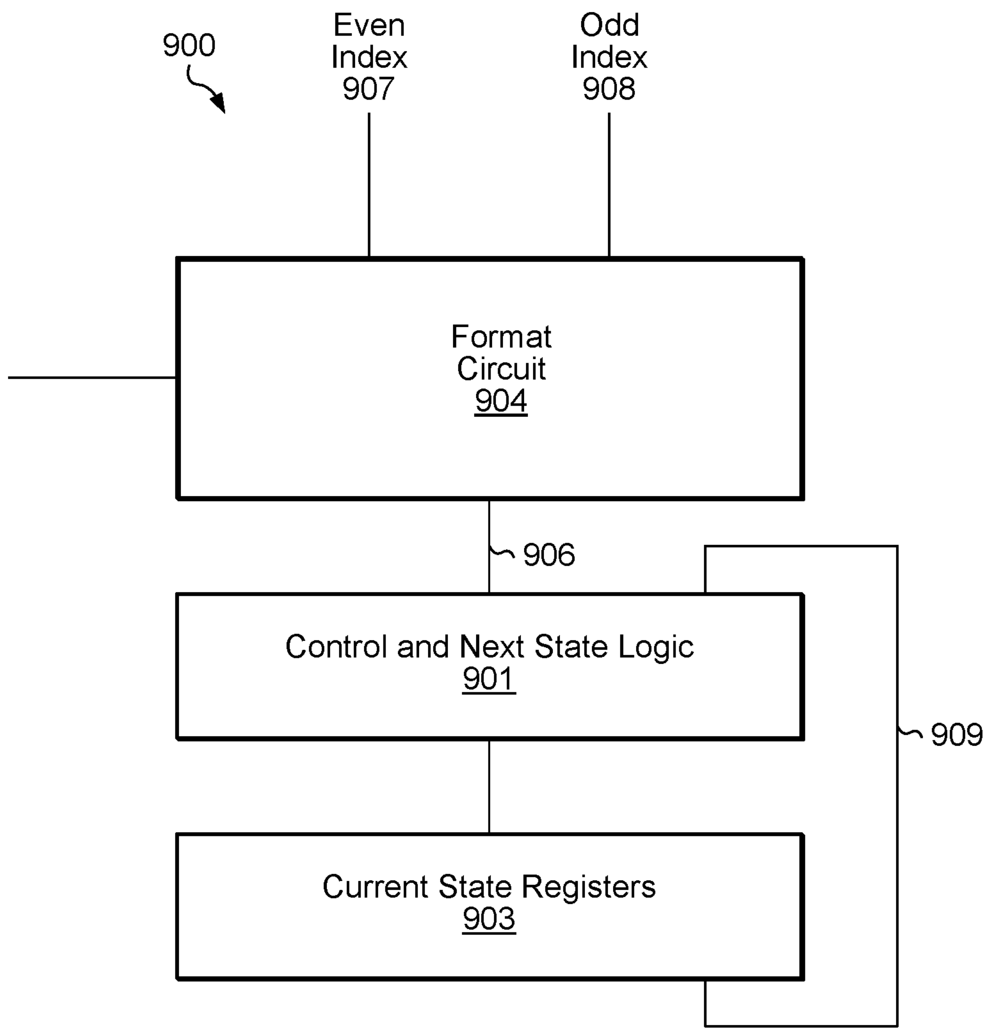
FIG. 9 illustrates a block diagram of a address generator circuit.

Moving to FIG. 9, a block diagram of an address generator circuit 900 is illustrated. Address generator circuit 900 may, in various embodiments, correspond to either of Read Address Generator 205 or Write Address Generator 204 as illustrated in the embodiment depicted in FIG. 2, and may be configured to implement one or more of the algorithms depicted in FIG. 3 through FIG. 8. By implementing the aforementioned algorithms using address generator circuit 900, power and area associated with a software implementation of an address generation algorithm may be saved. In the illustrated embodiment, address generator circuit 900 includes Control and Next State Logic 901, Format Circuit 904, and Current State Registers 903. The count value as well as half step value are communicated via 906. Additionally, the count value, increment updates, etc., are communicated via 909.

Control and Next State Logic 901 may be associated with multiple registers holding state, such as, e.g., the current value of count and increment, as well as other parameters used in address generation. Any suitable arrangement of the multiple registers may be updated in isolation, or together, either sequentially or in parallel.

Current State Registers 903 may, in various embodiments, may include multiple registers, each of which may be configured to store values related to FFT and twiddle factor address calculations. Each of the multiple registers may include multiple storage elements, each storage element configured to store a respective data bit of a particular value, such as, e.g., a step value, a base value, a stride value, or any other suitable values used in the generation of the access addresses. Such values may, in some embodiments, be configurable via system software.

In other embodiments, values stored in Current State Registers 903 may be updated or modified during operation. For example, circuitry may increase the step value using a one bit shift left operation, and update the relevant bits in the Current State Registers 903.

As described below, in more detail, in regard to FIG. 10, Format Circuit 904 may generate the even and odd indices for accessing the memory or twiddle factors during FFT operations. Dependent on whether address generator is being employed to generate memory access addresses, or twiddle factor access address, Format Circuit 904 may be configured to perform different format operations.

During the generation of access addresses for twiddle factors, an index value may be generated to be used as an address. In response to a determination that a particular bit of the count value is changing as Control and Next State Logic 901 increments, the index value may be incremented by the stride value. In various embodiments, the index value may be initialized or re-initialized to the base value or other suitable initial value.

In some embodiments, Format Circuit 904 may combine count value 906 with other values to generate Even Index 907 and Odd Index 908. In various embodiments, even index 907 and Odd Index 908 may correspond to the even and odd indices described in regard to FIG. 3. In some cases, such as the generation of twiddle factor addresses, Format Circuit 904 may be omitted from address generator circuit 900.

Control and next state logic 901 may, in various embodiments, compare count value 906 to a predetermined value. For example, in some embodiments, control and next state logic 901 may compare counter value 906 to a data word consisting of all logical-1 values. Additionally, Control and next state logic 901 may determine when all the stages of an FFT operation have completed.

During the generation of access addresses for twiddle factors, Control and next state logic 901 may be configured to determine if a particular bit of the count value is changing from a particular count value to a next count value. The particular bit of the count value may, in some embodiments, be a constant bit of the count value, or any other suitable data bit included in the count value. Control and next state logic 901 may determine the value of the particular bit for a current count value and then, in response to the count value being incremented, determine the value of the particular bit for the newly updated count value. In various embodiments, Control and next state logic 901 may then perform an exclusive OR operation on the two values of the particular bit.

It is noted that the embodiment illustrated in FIG. 9 is merely an example. In other embodiments, various versions of format circuit 904 may be employed that allow the generation of both memory access addresses and twiddle factor access addresses using a single address generator circuit.

Figure 10:
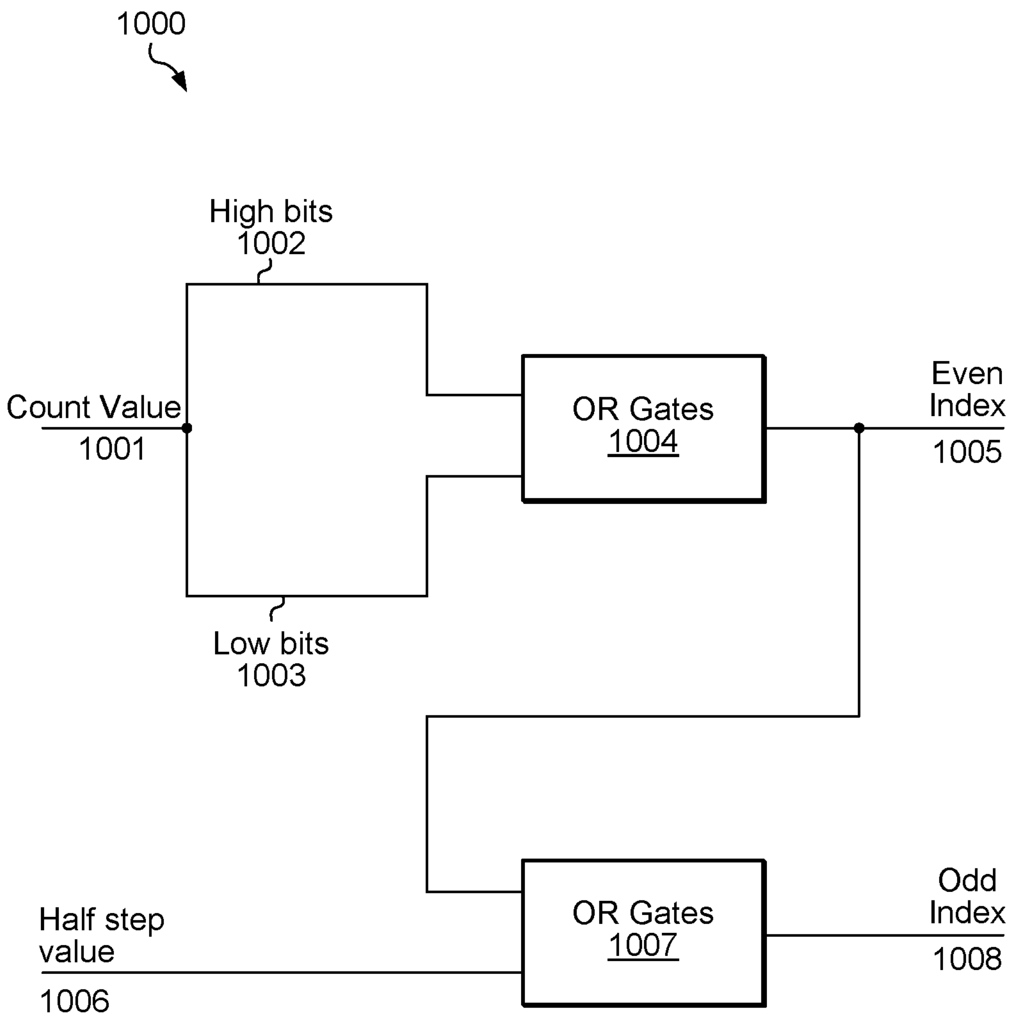
FIG. 10 illustrates a block diagram of a format circuit included in an address generator circuit.

Turning now to FIG. 10, a block diagram of a format circuit that may be used in the generation of memory access addresses for a FFT operation is illustrated. In some embodiments, Format circuit 1000 may correspond to Format circuit 904 as depicted in the embodiment illustrated in FIG. 9. In the illustrated embodiment, Format circuit 1000 includes OR gates 1004 and 1007.

During operation, count value 1001, which may correspond to count value 906 as illustrated in FIG. 9, may be split into high bits 1002 and low bits 1003. Each of high bits 1002 and low bits 1003 are coupled to the inputs of OR gates 1004. OR gates 1004 may include multiple OR gates each or which performed a bitwise OR of corresponding bits from high bits 1002 and low bits 1003. The result of the bitwise OR operation performed by OR gates 1004 generates even index 1005. In various embodiments, even index 1005 may correspond to the even indices depicted in FIG. 3 and FIG. 4.

As described above in regard to FIG. 3, FIG. 4, and FIG. 5, a single count value may be used to generate multiple indices, such as, even index 907 and odd index 908 as illustrated in FIG. 9, for example. In the present embodiment, odd index 1008 is generated using even index 1005 and half step value 1006. It is noted that half step value 1006 may be the step value by which the count value was increment divided by two. In a similar fashion to OR gates 1004, OR gates 1007 may be configured to perform a bitwise OR operation on the two aforementioned values to generate odd index 1008.

It is noted that the method illustrated in FIG. 10 is merely an example embodiment. The generation of even index 1005 and odd index 1008 as depicted in FIG. 10 represents only one type of index generation. In other embodiments, different combinations of data bits including the count values, step value, and the like, may be combined in different ways, using different logic functions, to achieve different address sequences.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:

a plurality of registers configured to store information used in execution of a Fast Fourier Transform (FFT) algorithm; and circuitry coupled to the plurality of registers, wherein the circuitry is configured to:

set a count value to an initial value; and iteratively process each stage of a plurality of stages included in the FFT algorithm;

wherein to process a particular stage of the plurality of stages, the circuitry is further configured to:

combine a first portion of the count value and a second portion of the count value to generate a first output value;

combine the first output value and an increment value to generate a second output value, wherein the first output value and the second output value correspond to addresses used to access memory locations in a pattern according to execution of the FFT algorithm;

increment the count value by the increment value to generate a next count value; and wherein the circuitry is further configured to, in response to a determination that a given stage of the plurality of stages has completed:

re-set the count value to the initial value; and modify the increment value.

2. The apparatus of claim 1, wherein the increment value is stored in a particular register of the plurality of registers.

3. The apparatus of claim 2, wherein to modify the increment value, the circuitry is further configured to perform a shift left operation in the particular register of the plurality of registers.

4. The apparatus of claim 1, wherein the circuitry is further configured to compare a bit at a first position of the count value to a bit at a second position of the next count value, wherein the first position is the same as the second position.

5. The apparatus of claim 4, wherein the circuitry includes a counter circuit, and wherein to compare the bit at the first position of the count value to the bit at the second position of the next count value, the circuitry is further configured to perform an exclusive OR operation on the bit at the first position of a current value of the counter circuit and the bit at the second position of a next value of the counter circuit.

6. The apparatus of claim 1, wherein the second output value is dependent upon the first output value.

7. A method, comprising:

setting a count value of a counter circuit to an initial value;

iteratively process each stage of a plurality of stages included in a Fast Fourier Transform (FFT) algorithm;

wherein processing a particular stage of the plurality of stages includes:

combining a first portion of the count value of the counter circuit and a second portion of the count value of the counter circuit to generate a first output value;

combining the first output value and an increment value to generate a second output value;

wherein the first output value and the second output value correspond to addresses used to access memory locations in a pattern according to execution of the FFT algorithm;

incrementing the count value of the counter circuit by the increment value to generate a next count value; and in response to determining a given stage of the plurality of stages has completed:

re-setting the count value to the initial value; and modifying the increment value.

8. The method of claim 7, wherein modifying the increment value includes initiating a shift lift operation in a register storing the increment value.

9. The method of claim 7, further comprising comparing a first bit of the count value of the counter circuit to a second bit at of the next count value of the counter circuit, the first bit and the second bit occupy a same bit position the count value of the counter circuit and next count value of the counter circuit, respectively.

10. The method of claim 9, wherein comparing the first bit and the second bit includes performing an exclusive OR operation on the first bit and the second bit.

11. The method of claim 9, wherein the second output value is dependent upon the first output value.

12. The method of claim 11, wherein combining the first portion of the count value and the second portion of the count value includes combining, using a bitwise OR operation, the first portion of the count value and the second portion of the count value to generate the first output value, and combining the first output value with a particular value stored in a register using a bitwise OR operation to generate the second output value, wherein the particular value is based upon the increment value.

13. A system, comprising:

a processor;

a first memory; and a signal processing unit including at least one memory and an address generator circuit, wherein the address generator circuit is configured to:

process each stage of a plurality of stages included in a Fast Fourier Transform (FFT) operation;

set a count value to an initial value;

wherein to process a particular stage of the plurality of stages, the signal processing unit is further configured to:

combine a first portion of the count value and a second portion of the count value to generate a first output value;

combine the first output value and an increment value to generate a second output value, wherein the first output value and the second output value correspond to addresses used to access memory locations in a pattern according to execution of the FFT operation;

increment the count value by the increment value to generate a next count value; and wherein the signal processing unit is further configured to, in response to a determination that a give stage of the plurality of stages has completed:

re-set the count value to the initial value; and modify the increment value.

14. The system of claim 13, wherein the signal processing unit further includes a plurality of register circuits, wherein the increment value is stored in a particular register circuit of the plurality of register circuits.

15. The system of claim 14, wherein to modify the increment value, the address generator circuit is further configured to perform a shift left operation in the particular register circuit of the plurality of register circuits.

16. The system of claim 15, wherein address generator circuit is further configured to compare a first bit of the count value to a second bit at of the next count value, wherein the first bit and the second bit occupy a same bit position in the count value and next count value, respectively.

17. The system of claim 16, wherein to compare the first bit and the second bit, the address generator circuit is further configured to perform an exclusive OR operation on the first bit and the second bit.

18. The system of claim 17, wherein to combine the first portion of the count value and the second portion of the count value, the address generator circuit is further configured to combine, using a bitwise OR operation, the first portion of the count value and the second portion of the count value to generate the first output value, and wherein to combine the first output value with the increment value, the address generator circuit is further configured to perform a bitwise OR operation using the first output value and the increment value to generate the second output value.

* * * * *